United States Patent
Giffel

(10) Patent No.: US 8,984,458 B2
(45) Date of Patent: Mar. 17, 2015

(54) DYNAMIC RULE CHECKING IN ELECTRONIC DESIGN AUTOMATION

(75) Inventor: Barry A. Giffel, Wake Forest, NC (US)

(73) Assignee: Synopsys, Inc., Mountain View, CA (US)

( * ) Notice: Subject to any disclaimer, the term of this patent is extended or adjusted under 35 U.S.C. 154(b) by 277 days.

(21) Appl. No.: 12/579,309

(22) Filed: Oct. 14, 2009

(65) Prior Publication Data

US 2011/0023001 A1    Jan. 27, 2011

Related U.S. Application Data

(60) Provisional application No. 61/227,717, filed on Jul. 22, 2009.

(51) Int. Cl.
  *G06F 17/50* (2006.01)
(52) U.S. Cl.
  CPC ........ *G06F 17/5022* (2013.01); *G06F 17/5081* (2013.01)
  USPC ........................................ 716/112
(58) Field of Classification Search
  CPC .................................. G06F 17/5081
  USPC .................................. 716/100–139
  See application file for complete search history.

(56) References Cited

U.S. PATENT DOCUMENTS

| | | | | |
|---|---|---|---|---|
| 5,293,479 | A * | 3/1994 | Quintero et al. | 715/841 |
| 5,889,932 | A * | 3/1999 | Adegeest et al. | 358/1.18 |
| 6,298,319 | B1 * | 10/2001 | Heile et al. | 703/26 |
| 2004/0221249 | A1 * | 11/2004 | Lahner et al. | 716/4 |
| 2004/0225988 | A1 * | 11/2004 | Petunin et al. | 716/11 |
| 2005/0216835 | A1 * | 9/2005 | Aoki et al. | 715/530 |
| 2008/0229262 | A1 * | 9/2008 | Harashima et al. | 716/5 |
| 2012/0047479 | A1 * | 2/2012 | Paris et al. | 716/112 |

\* cited by examiner

*Primary Examiner* — Vuthe Siek
*Assistant Examiner* — Aric Lin
(74) *Attorney, Agent, or Firm* — Park, Vaughan, Fleming & Dowler LLP; Chia-Hsin Suen

(57) ABSTRACT

Some embodiments provide a system that provides design rule checking in an electronic design automation (EDA) application. During operation, the system detects a change to a schematic by a user of the EDA application. Next, the system automatically applies a set of dynamic design rules to the schematic upon detecting the change. Finally, the system notifies the user of a rule violation if the schematic violates one or more of the dynamic design rules. The system allows the user to specify which dynamic rules to apply when the user is modifying the schematic.

12 Claims, 6 Drawing Sheets

DYNAMIC RULE CHECKING IN ELECTRONIC DESIGN AUTOMATION

RELATED APPLICATIONS

This application claims priority to U.S. Provisional Application No. 61/227,717, entitled "Dynamic Rule Checking," by Barry Andrew Giffel, filed 22 Jul. 2009, the contents of which are herein incorporated by reference.

BACKGROUND

1. Technical Field

The present embodiments relate to electronic design automation (EDA). More specifically, the present embodiments relate to a method and system for enabling dynamic per-rule checking in EDA applications.

2. Related Art

Integrated circuit design often involves the use of schematics, which typically contain logical representations of components and wires in integrated circuits. EDA tools are typically used for creating schematics. For example, a schematic editor may allow a designer to create an electronic schematic of an integrated circuit. The electronic schematic may then be used by other EDA tools to simulate the operation of the integrated circuit, create a layout of the integrated circuit, and/or detect errors in the schematic.

To detect errors in a schematic, EDA tools may apply a set of design rules to the schematic to verify that the schematic satisfies recommended parameters for a particular type of integrated circuit design. If the schematic violates a design rule, the schematic may not result in a chip that operates as desired. For example, a schematic editor may apply design rules to the schematic to check for connectivity, physical, semantic, and/or compatibility issues in the schematic. Design rule violations may then be corrected by modifying the schematic.

SUMMARY

Some embodiments provide a system that provides design rule checking in an EDA application. During operation, the system detects a change to a schematic by a user of the EDA application. Next, the system automatically applies a set of dynamic design rules to the schematic upon detecting the change. Finally, the system notifies the user of a rule violation if the schematic violates one or more of the dynamic design rules.

In some embodiments, the system also obtains a selection of the dynamic design rules from the user.

In some embodiments, obtaining the selection of the dynamic design rules from the user involves obtaining a set of notification preferences associated with the dynamic design rules from the user, wherein the user is notified of the rule violation based on the notification preferences.

In some embodiments, each of the notification preferences is associated with a message, a warning, or an error.

In some embodiments, the dynamic design rules are obtained from the user through a graphical user interface (GUI) associated with the EDA application.

In some embodiments, the dynamic design rules are automatically applied to the schematic based on at least one of a size of the schematic and a preference associated with the user.

In some embodiments, the dynamic design rules correspond to semantic rules or electrical rules.

DETAILED DESCRIPTION

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present invention is not limited to the embodiments shown, but is to be accorded the widest scope consistent with the principles and features disclosed herein.

The data structures and code described in this detailed description are typically stored on a computer-readable storage medium, which may be any device or medium that can store code and/or data for use by a computer system.

The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing code and/or data now known or later developed.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium.

Furthermore, methods and processes described herein can be included in hardware modules or apparatus. These modules or apparatus may include, but are not limited to, an application-specific integrated circuit (ASIC) chip, a field-programmable gate array (FPGA), a dedicated or shared processor that executes a particular software module or a piece of code at a particular time, and/or other programmable-logic devices now known or later developed. When the hardware modules or apparatus are activated, they perform the methods and processes included within them.

Figure 1:
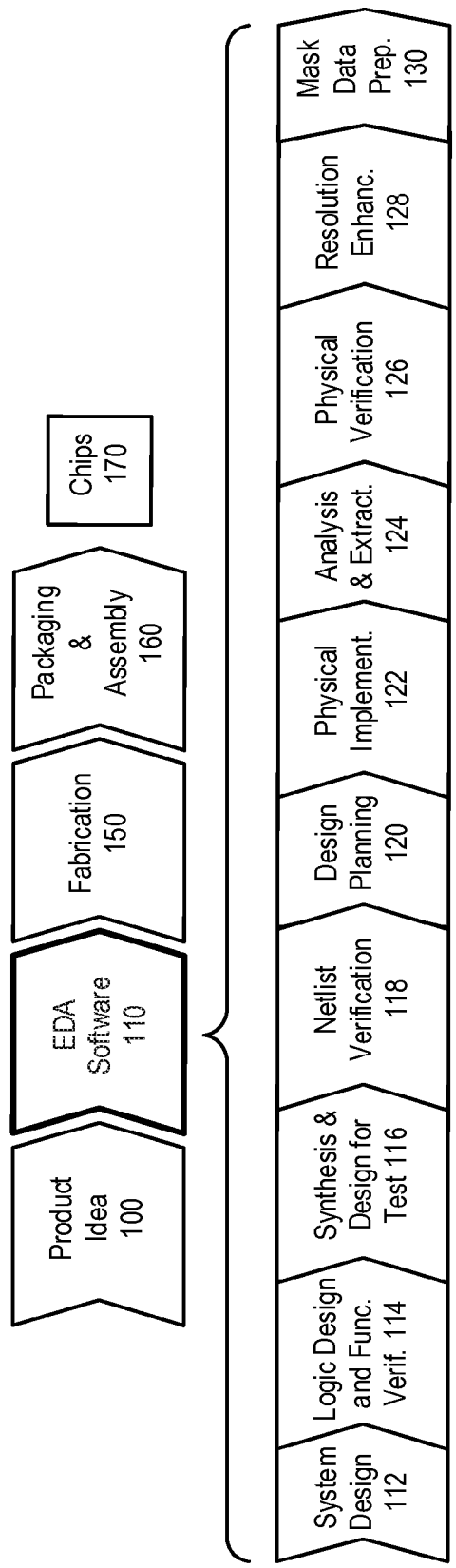
FIG. 1 shows a workflow associated with the design and fabrication of an integrated circuit in accordance with an embodiment.

FIG. 1 shows a workflow associated with the design and fabrication of an integrated circuit in accordance with an embodiment. The workflow may begin with a product idea (step 100), which may be realized using an integrated circuit that is designed using an electronic design automation (EDA) process (step 110). After the integrated circuit design is finalized, the design may undergo a fabrication process (step 150) and a packaging and assembly process (step 160) to produce chips 170.

The EDA process (step 110) includes steps 112-130, which are described below for illustrative purposes only and are not meant to limit the present invention. Specifically, the steps may be performed in a different sequence than the sequence described below.

During system design (step 112), circuit designers may describe the functionality to be implemented in the integrated circuit. They may also perform what-if planning to refine functionality, check costs, etc. Hardware-software architecture partitioning may also occur at this stage. Exemplary EDA software products from Synopsys, Inc. that may be used at this step include Model Architect, Saber®, System Studio, and DesignWare®.

During logic design and functional verification (step 114), the VHDL or Verilog code for modules in the system may be written and the design may be checked for functional accuracy, (e.g., the design may be checked to ensure that it produces the correct outputs). Exemplary EDA software products from Synopsys, Inc. that may be used at this step include VCS®, Vera®, DesignWare®, Magellan™, Formality®, ESP and Leda®.

During synthesis and design for test (step 116), the VHDL/Verilog may be translated to a netlist. Further, the netlist may be optimized for the target technology, and tests may be designed and implemented to check the finished chips. Exemplary EDA software products from Synopsys, Inc. that may be used at this step include Design Compiler®, Physical Compiler®, Test Compiler, Power Compiler™, FPGA Compiler, TetraMAX®, and DesignWare®.

During netlist verification (step 118), the netlist may be checked for compliance with timing constraints and for correspondence with the VHDL/Verilog source code. Exemplary EDA software products from Synopsys, Inc. that may be used at this step include Formality®, PrimeTime®, and VCS®.

During design planning (step 120), an overall floorplan for the chip may be constructed and analyzed for timing and top-level routing. Exemplary EDA software products from Synopsys, Inc. that may be used at this step include Astro™ and IC Compiler products.

During physical implementation (step 122), circuit elements may be positioned in the layout (placement) and may be electrically coupled (routing). Exemplary EDA software products from Synopsys, Inc. that may be used at this step include Astro™ and IC Compiler products.

During analysis and extraction (step 124), the circuit's functionality may be verified at a transistor level and parasitics may be extracted. Exemplary EDA software products from Synopsys, Inc. that may be used at this step include AstroRail™, PrimeRail, PrimeTime®, and Star-RCXT™.

During physical verification (step 126), the design may be checked to ensure correctness for manufacturing, electrical issues, lithographic issues, and circuitry. Hercules™ is an exemplary EDA software product from Synopsys, Inc. that may be used at this step.

During resolution enhancement (step 128), geometric manipulations may be performed on the layout to improve manufacturability of the design. Exemplary EDA software products from Synopsys, Inc. that may be used at this step include Proteus/ProGen, ProteusAF, and PSMGen.

During mask data preparation (step 130), the design may be "taped-out" to produce masks that are used during fabrication.

Figure 2:
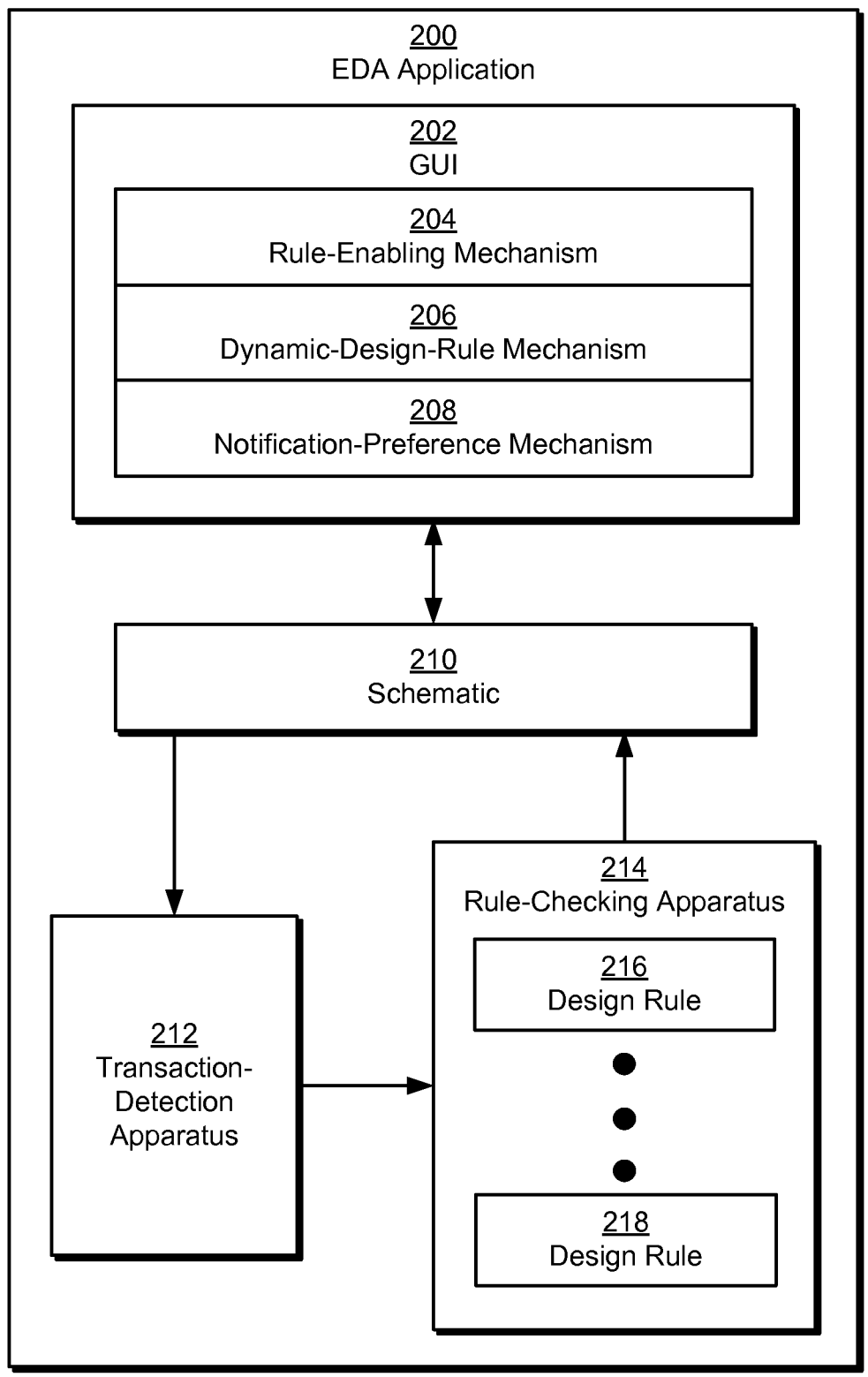
FIG. 2 shows an electronic design automation (EDA) application in accordance with an embodiment.

FIG. 2 shows an EDA application 200 in accordance with an embodiment. As shown in FIG. 2A, EDA application 200 includes a graphical user interface (GUI) 202, a schematic 210, a transaction-detection apparatus 212, and a rule-checking apparatus 214. Each of these components is described in further detail below.

Schematic 210 may correspond to an abstract representation of an integrated circuit that uses graphical objects to represent components in the integrated circuit. For example, schematic 210 may contain symbols that represent resistors, capacitors, transistors, logic gates, and/or other components in the integrated circuit. The graphical objects may additionally be connected by lines that represent power and signal connections between the components. In other words, the functionality of the integrated circuit may be illustrated by the components and interconnections within schematic 210.

Furthermore, schematic 210 may be created using EDA application 200. For example, EDA application 200 may correspond to a schematic editor that allows a user to create schematic 210 on a computer system. EDA application 200 may also allow the user to simulate and/or verify schematic 210. In particular, EDA application 200 may provide design rule checking to ensure that schematic 210 can be converted into a valid netlist and/or a hardware description language (HDL) description of the integrated circuit, and that the resulting chip operates as desired.

As shown in FIG. 2, rule-checking apparatus 214 includes a set of design rules 216-218 to be applied to schematic 210. Design rules 216-218 may be used to ensure that schematic 210 adheres to a set of electrical, physical, semantic, and/or compatibility constraints. For example, design rules 216-218 may check for floating pins, shorts, connection issues, and/or naming issues in schematic 210. Violations to design rules 216-218 found in schematic 210 may then be reported to the user so that the user may correct the violations. Moreover, design rules 216-218 may be selectively applied to schematic 210 based on the user's preferences.

In particular, a rule-enabling mechanism 204 within GUI 202 may allow the user to select and deselect design rules 216-218 for application to schematic 210. For example, rule-enabling mechanism 204 may allow the user to check and uncheck boxes next to descriptions or names of design rules 216-218; design rules associated with checked boxes may be dynamically applied to schematic 210 by rule-checking apparatus 214, while design rules associated with unchecked boxes may be omitted during dynamic design rule checking of schematic 210.

Those skilled in the art will appreciate that EDA tools may perform design rule checking only after schematics are saved and/or completed. Furthermore, application of design rules to schematics may require significant computational resources. For example, design rule checking may be performed several times during the creation of schematic 210 and require one to several minutes to complete each time, based on the complexity and size of schematic 210. As a result, the user of EDA application 200 may receive feedback regarding the correctness of schematic 210 only after long periods of delay, which may interfere with the user's ability to notice changes to schematic 210 that cause violations to design rules 216-218 and prevent the user from responding promptly to the violations. For example, the user may make a series of changes to schematic 210 before running design rule checking on schematic 210. Because changes to one part of schematic 210 may affect other parts of schematic 210, a rule violation caused by the first change in the series may require that the user update multiple parts of schematic 210 to correct the rule violation.

To facilitate feedback associated with the verification of schematic 210, EDA application 200 may include functionality to perform dynamic rule checking on schematic 210. In particular, rule-checking apparatus 214 may apply one or more design rules 216-218 to schematic 210 as changes to schematic 210 are made. Such changes may be detected by transaction-detection apparatus 212 as transactions associated with schematic 210. Consequently, rule-checking apparatus 214 may dynamically apply design rules 216-218 to schematic 210 at the end of each transaction.

As with the general use of design rules 216-218 with schematic 210, GUI 202 may allow the user to select design rules 216-218 for dynamic application to schematic 210. In particular, a dynamic-design-rule mechanism 206 provided by GUI 202 may include a number of user interface elements (e.g., checkboxes) that allow the user to specify a subset of design rules 216-218 to be applied to schematic 210 after a change to schematic 210 is detected by transaction-detection apparatus 212.

In one or more embodiments, design rules 216-218 are dynamically applied to schematic 210 based on the size or complexity of schematic 210 and/or the user's preferences. For example, a computationally expensive design rule 216-218 may be omitted from dynamic application to a large schematic 210 because the design rule check may take too long to complete. On the other hand, the user may select a design rule as a dynamic design rule if the user is prone to making changes that trigger violations of the design rule. In other words, the user may use GUI 202 to customize the use of design rules 216-218 with schematic 210, as well as the frequency with which each design rule is applied to schematic 210.

The user may also use a notification-preference mechanism 208 in GUI 202 to specify preferences regarding notifications of design rule violations by schematic 210. For example, the user may select a notification of a design rule violation as a message, warning, or error within notification-preference mechanism 208. Rule-enabling mechanism 204, dynamic-design-rule mechanism 206, and notification-preference mechanism 208 are described in further detail below with respect to FIGS. 3A-3B.

Figure 3A:
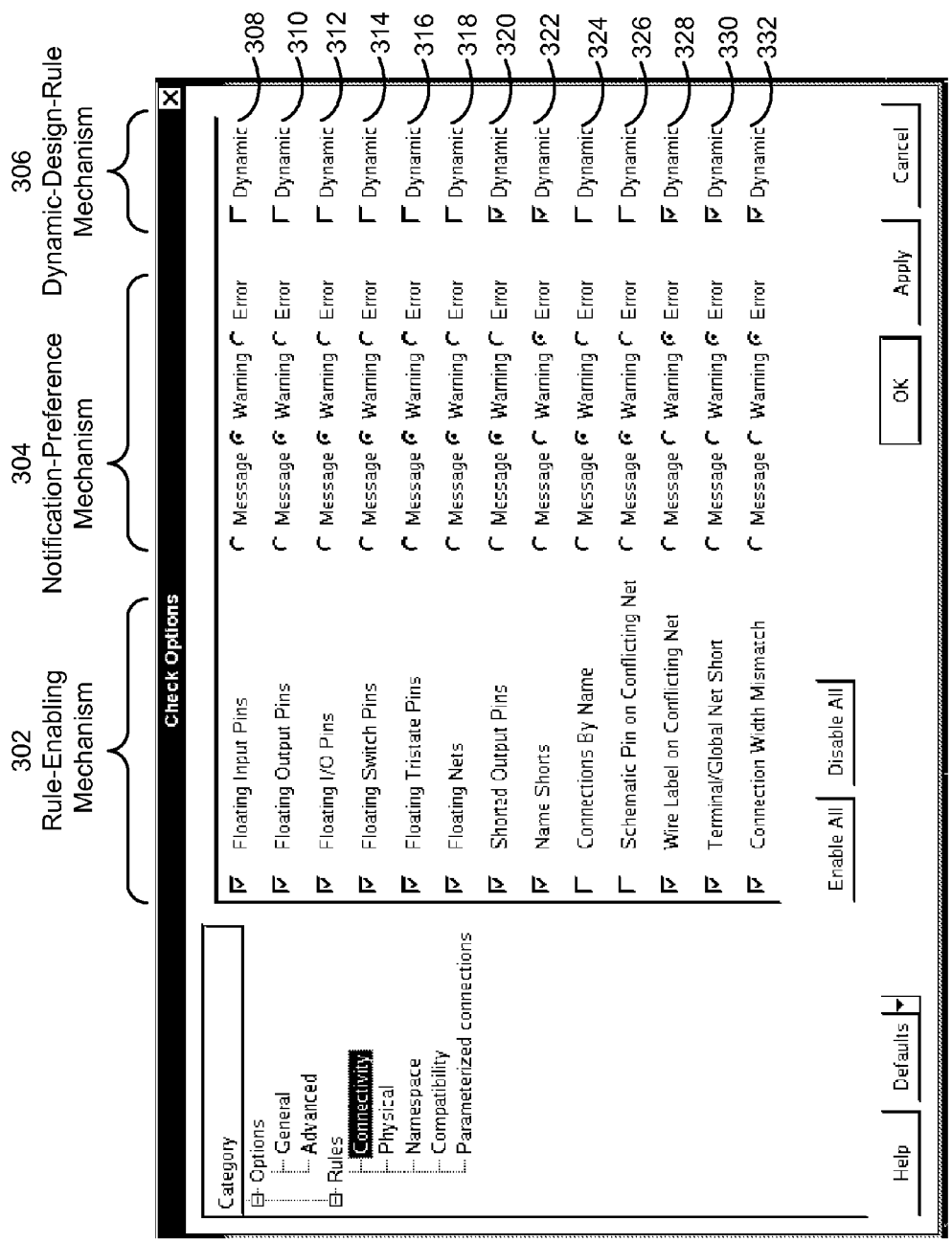
FIG. 3A shows an exemplary screenshot in accordance with an embodiment.

FIG. 3A shows an exemplary screenshot in accordance with an embodiment. More specifically, FIG. 3A shows a screenshot of a GUI for an EDA application, such as GUI 202 of FIG. 2. The GUI of FIG. 3A may be used to obtain preferences from a user regarding the application of a set of design rules 308-332 to a schematic, such as schematic 210 of FIG. 2. As shown in FIG. 3A, the GUI includes a rule-enabling mechanism 302, a notification-preference mechanism 304, and a dynamic-design-rule mechanism 306. Within the GUI, design rules 308-332 may be associated with connectivity in the schematic and may include both semantic rules and electrical rules. For example, design rule 320 (e.g., "Shorted Output Pins") may correspond to an electrical rule, while design rule 324 (e.g., "Connections By Name") may correspond to a semantic rule.

Rule-enabling mechanism 302 may allow the user to select or deselect design rules 308-332 for use in design rule checking of the schematic. More specifically, rule-enabling mechanism 302 includes a set of checkboxes next to names of design rules 308-332. The user may select a checkbox next to a design rule to check the schematic using the design rule, or the user may clear the checkbox to omit the design rule from design rule checking of the schematic. In particular, the checkboxes associated with design rules 308-322 (e.g., "Floating Input Pins," "Floating Output Pins," "Floating I/O Pins," "Floating Switch Pins," "Floating Tristate Pins," "Floating Nets," "Shortened Output Pins," "Name Shorts") and design rules 328-332 (e.g., "Wire Label on Conflicting Net," "Terminal/Global Net Short," "Connection Width Mismatch") are checked, indicating that design rules 308-322 and 328-332 are to be used in design rule checking of the schematic. On the other hand, checkboxes associated with design rules 324-326 (e.g., "Connections By Name," "Schematic Pin on Conflicting Net") are unchecked, indicating that design rules 324-326 are to be omitted from design rule checking of the schematic.

Notification-preference mechanism 304 includes a set of radio buttons associated with each design rule 308-332 that allow the user to select the type of notification generated when the design rule is violated. The user may select the radio button next to "Message" to receive a message of a violation, the radio button next to "Warning" to receive a warning of the violation, or the radio button next to "Error" to receive an error associated with the violation. Each type of notification may correspond to a different level of severity associated with a particular design rule violation. For example, a "message" notification may simply notify the user of a design rule violation, a "warning" notification may require that the user acknowledge the notification, and an "error" notification may require that the user correct the violation before completing the schematic.

Finally, dynamic-design-rule mechanism 306 may allow the user to select design rules 308-332 for dynamic rule checking of the schematic. As described above, dynamic rule checking of the schematic may automatically apply design rules selected within dynamic-design-rule mechanism 306 to the schematic upon detecting a change to the schematic. To specify a design rule 308-332 for dynamic rule checking, the user may select a checkbox associated with the design rule within dynamic-design-rule mechanism 306. As shown in FIG. 3A, checkboxes associated with design rules 320-322 and 328-332 are selected within dynamic-design-rule mechanism 306, indicating that design rules 320-322 and 328-332 are to be applied to the schematic whenever a change is made to the schematic. Conversely, checkboxes associated with design rules 308-318 and 324-326 within dynamic-design-rule mechanism 306 are cleared, indicating that design rules 308-318 and 324-326 are to be manually applied to the schematic (e.g., when the user saves the schematic).

Figure 3B:
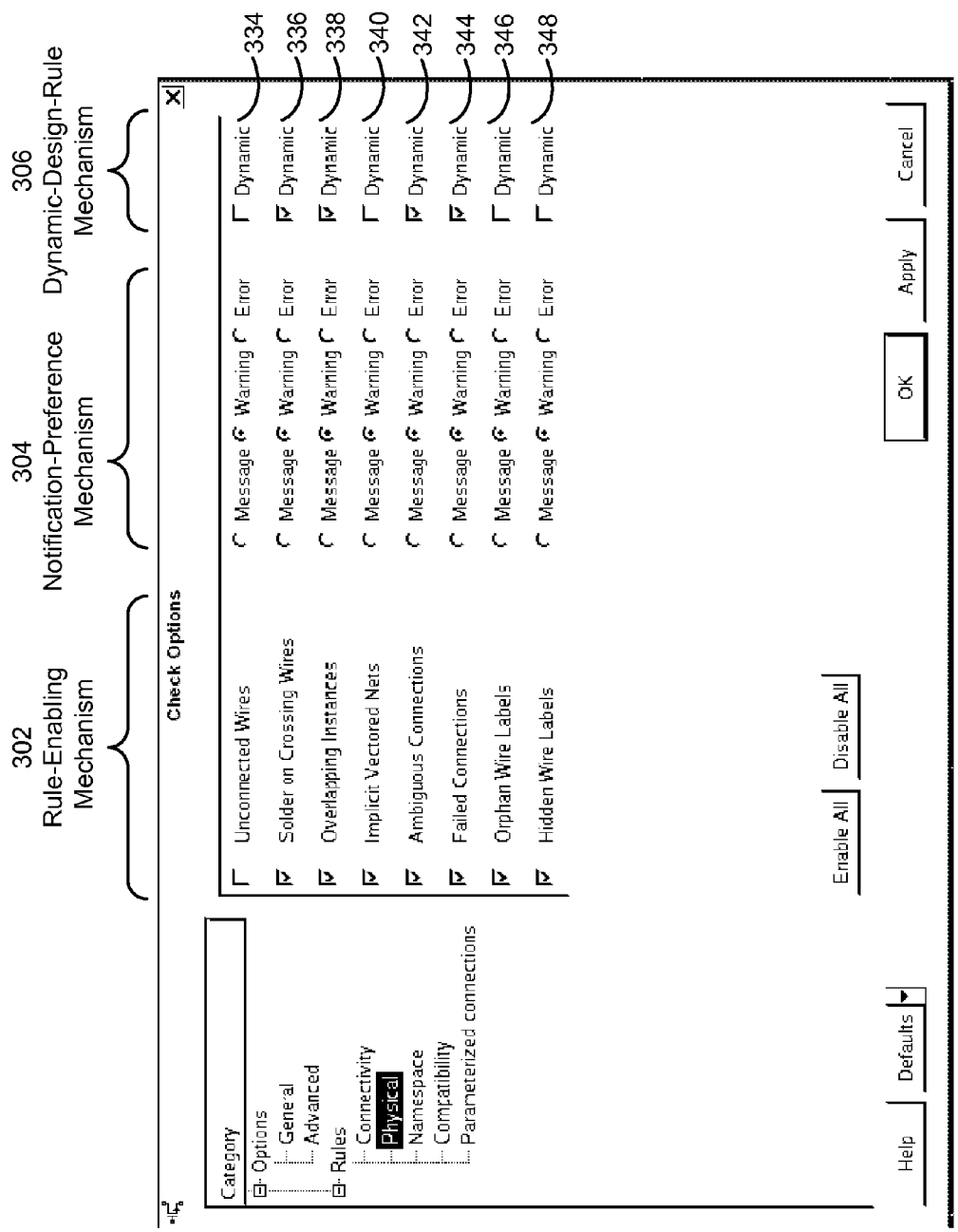
FIG. 3B shows an exemplary screenshot in accordance with an embodiment.

FIG. 3B shows an exemplary screenshot in accordance with an embodiment. In particular, FIG. 3B shows the GUI of FIG. 3A with a different set of design rules 334-348 to be configured for use with the schematic. As shown in FIG. 3B, design rules 334-348 may be associated with physical parameters in the schematic. Within rule-enabling mechanism 302, design rule 334 (e.g., "Unconnected Wires") is not currently enabled for use with the schematic, while design rules 336-348 (e.g., "Solder on Crossing Wires," "Overlapping Instances," "Implicit Vectored Nets," "Ambiguous Connections," "Failed Connections," "Orphan Wire Labels," "Hidden Wire Labels") are. Notification-preference mechanism 304 indicates that notifications associated with violations of selected design rules 336-348 are to be generated as warnings. Finally, dynamic-design-rule mechanism 306 shows that design rules 336-338 and 342-344 are to be automatically applied to the schematic whenever a change is detected in the schematic.

The user may change preferences associated with design rules 334-348 by interacting with user interface elements provided by rule-enabling mechanism 302, notification-preference mechanism 304, and dynamic-design-rule mechanism 306. For example, the user may remove one or more design rules 336-348 from use with the schematic by clearing the checkboxes associated with the design rules within rule-enabling mechanism 302. Similarly, the user may change the type of notification for a violation of a particular design rule 336-348 to a message or an error by selecting the appropriate radio button within notification-preference mechanism 304.

The user may also add one or more design rules 340 and 346-348 to dynamic rule checking of the schematic by selecting checkboxes associated with the design rules within dynamic-design-rule mechanism 306. Alternatively, the user may clear checkboxes associated with one or more design rules 336-338 and 342-344 if the user does not want the design rules to be dynamically applied to the schematic.

Figure 4:
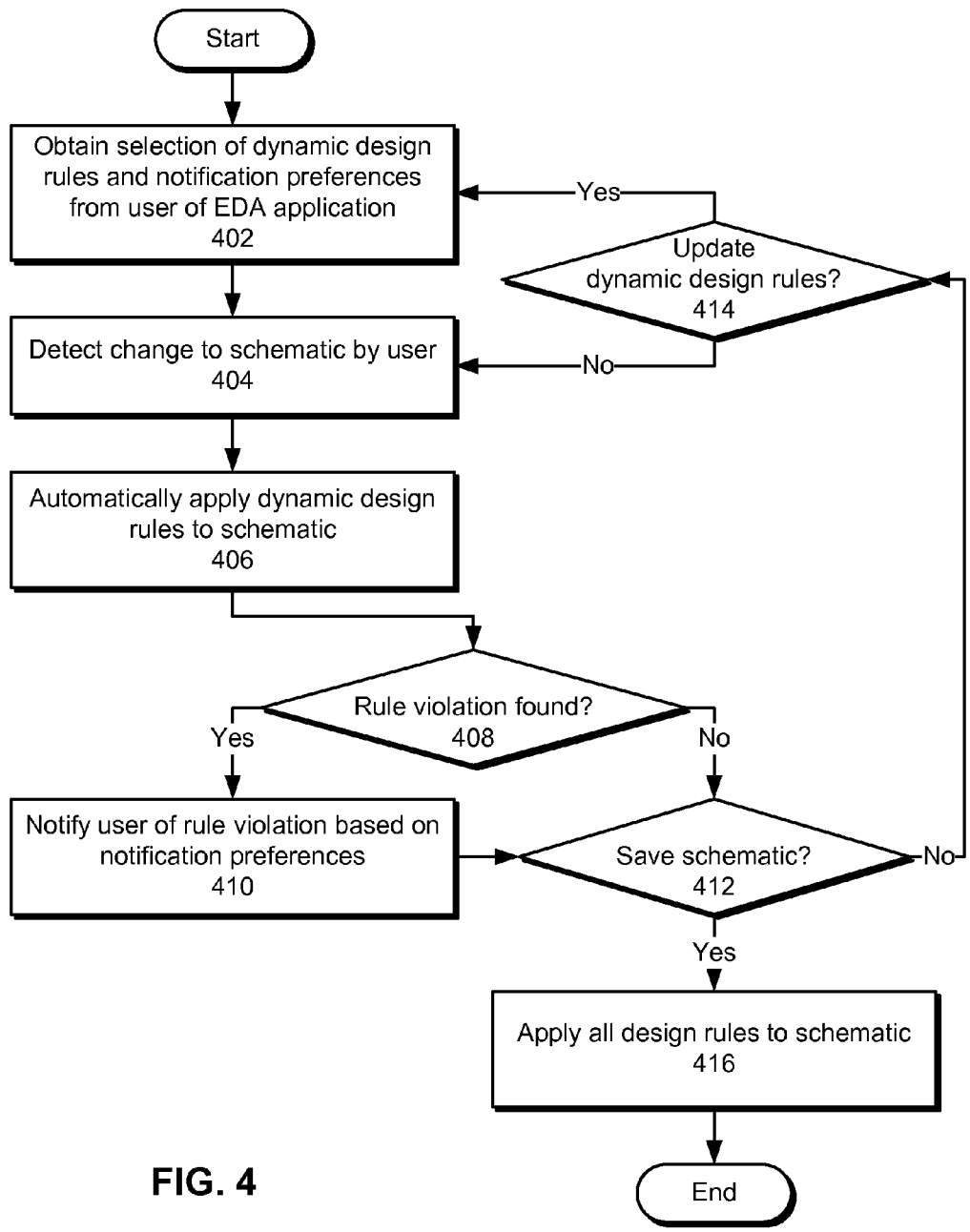
FIG. 4 shows a flowchart illustrating the process of providing design rule checking in an EDA application in accordance with an embodiment.

FIG. 4 shows a flowchart illustrating the process of providing design rule checking in an EDA application in accordance with an embodiment. In one or more embodiments, one or more of the steps may be omitted, repeated, and/or performed in a different order. Accordingly, the specific arrangement of steps shown in FIG. 4 should not be construed as limiting the scope of the embodiments.

Initially, a selection of a set of dynamic design rules and notification preferences associated with the dynamic design rules is obtained from a user of the EDA application (operation 402). The dynamic design rules may correspond to design rules that are to be applied to a schematic whenever a change in the schematic is detected. The notification preferences may represent the user's preferences regarding notification of violations of the dynamic design rules. For example, the user may specify a notification via a message, warning, or error whenever a specific dynamic design rule is violated by the schematic.

Next, a change to the schematic is detected (operation 404). The change may be detected as a transaction associated with the schematic in the EDA application. Upon detecting the change, the dynamic design rules are automatically applied to the schematic (operation 406) to detect rule violations in the schematic (operation 408). If a rule violation is found (e.g., if the schematic does not conform to a design rule), the user is notified of the rule violation based on a notification preference associated with the violated design rule (operation 410). For example, the user may receive an error associated with the rule violation if the user specified an error notification for the violated dynamic design rule in operation 402. If no rule violations are found, no notifications of violations are generated.

The schematic may also be saved (operation 412) by the user. For example, the user may save the schematic after the user has made a set of changes to the schematic and/or has completed the schematic. If the schematic is saved, all design rules associated with the schematic are applied (operation 416) to verify the schematic. Alternatively, if editing of the schematic is to continue, the user may update the dynamic design rules (operation 414). For example, the user may add dynamic design rules for automatic application to the schematic, remove one or more design rules from the dynamic design rules, and/or change notification preferences associated with the dynamic design rules. If the design rules are to be updated, a new selection of dynamic design rules and/or notification preferences is obtained from the user (operation 402). If the design rules do not require updating, no action is required.

Changes in the schematic may continue to be analyzed for adherence to the dynamic design rules (operations 404-408), rule violations may be reported to the user (operation 410), and the dynamic design rules may be updated (operations 402, 414) until the schematic is saved and verified using all design rules associated with the schematic (operations 412, 416). Consequently, the use of dynamic design rules may allow the user to verify the schematic after each change is made to the schematic. Frequent verification of the schematic may additionally reduce the incidence of rule violations in the schematic by allowing the user to respond promptly to the rule violations. Furthermore, the user may control the operation, timing, and frequency of design rule checking for the schematic by selecting dynamic design rules and notification preferences for use with the schematic.

Figure 5:
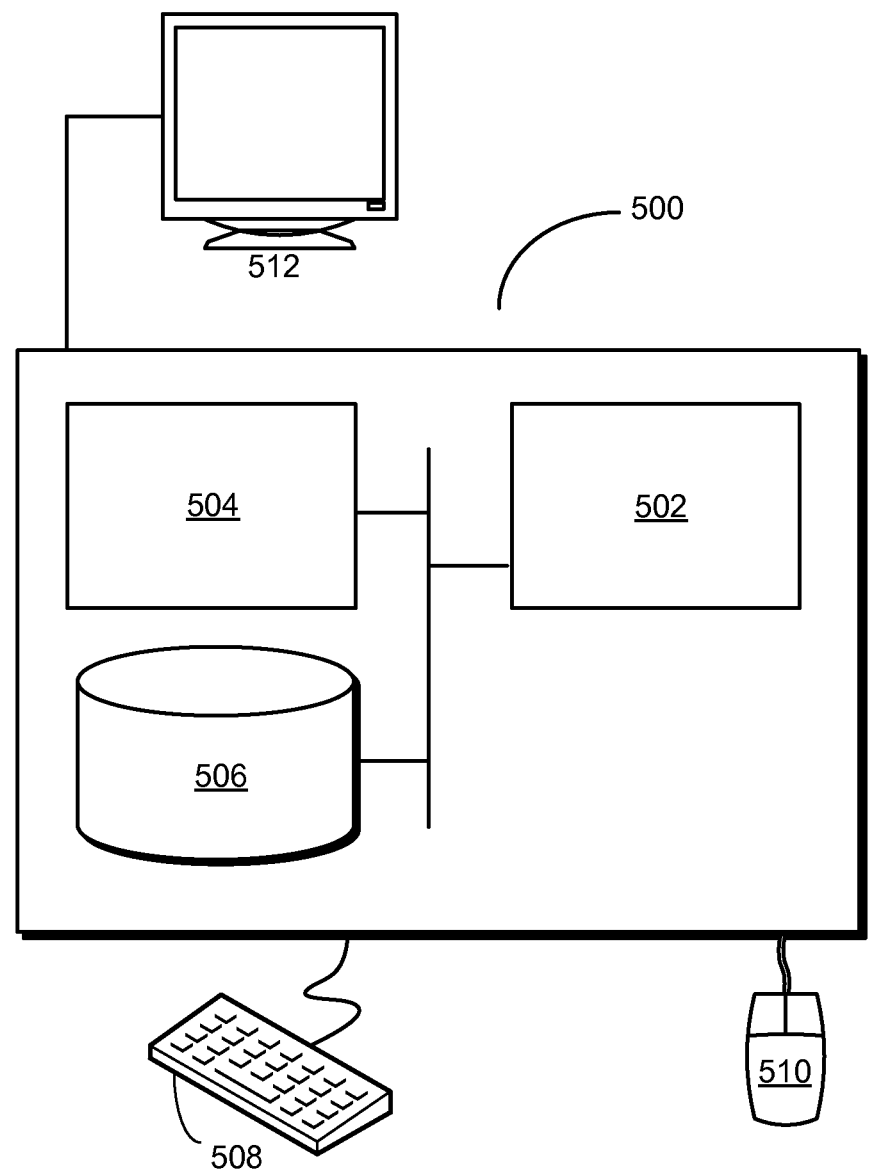
FIG. 5 shows a computer system in accordance with an embodiment.

FIG. 5 shows a computer system 500 in accordance with an embodiment. Computer system 500 includes a processor 502, memory 504, storage 506, and/or other components found in electronic computing devices. Processor 502 may support parallel processing and/or multi-threaded operation with other processors in computer system 500. Computer system 500 may also include input/output (I/O) devices such as a keyboard 508, a mouse 510, and a display 512.

Computer system 500 may include functionality to execute various components of the present embodiments. In particular, computer system 500 may include an operating system (not shown) that coordinates the use of hardware and software resources on computer system 500, as well as one or more applications that perform specialized tasks for the user. To perform tasks for the user, applications may obtain the use of hardware resources on computer system 500 from the operating system, as well as interact with the user through a hardware and/or software framework provided by the operating system.

In one or more embodiments, computer system 500 provides a system for providing design rule checking in an EDA application. The system may include a transaction-detection apparatus that detects a change to a schematic by a user of the EDA application. The system may also include a rule-checking apparatus that automatically applies a set of dynamic design rules to the schematic upon detecting the change. Finally, the system may include a graphical user interface (GUI) that notifies the user of a rule violation if the schematic violates one or more of the dynamic design rules.

In addition, one or more components of computer system 500 may be remotely located and connected to the other components over a network. Portions of the present embodiments (e.g., GUI, transaction-detection apparatus, rule-checking apparatus, etc.) may also be located on different nodes of a distributed system that implements the embodiments. For example, the present embodiments may be implemented using a cloud computing system that enables the creation of layouts on a remote EDA application.

The foregoing descriptions of various embodiments have been presented only for purposes of illustration and description. They are not intended to be exhaustive or to limit the present invention to the forms disclosed.

Accordingly, many modifications and variations will be apparent to practitioners skilled in the art. Additionally, the above disclosure is not intended to limit the present invention.

What is claimed is:

1. A computer-implemented method for providing design rule checking in an electronic design automation (EDA) application, comprising:
   obtaining, through a graphical user interface (GUI), a set of design rules and, for each design rule in the set of design rules, a dynamic rule setting that indicates whether or not the design rule is a dynamic design rule;
   obtaining a dynamic rule preference that indicates whether or not dynamic rule checking is to be performed; and
   in response to a computer determining that the dynamic rule preference indicates that dynamic rule checking is to be performed and that a schematic was switched from a read-only mode to a read/write mode, the computer automatically applying each design rule whose dynamic rule setting indicates that the design rule is a dynamic design rule to the schematic by:

destroying non-signed-off markers in the schematic;
creating new markers based on applying each design rule whose dynamic rule setting indicates that the design rule is a dynamic design rule;
adding only those new markers to the schematic that do not match an existing signed-off marker.

2. The computer-implemented method of claim 1, wherein the set of design rules correspond to semantic rules or electrical rules.

3. The computer-implemented method of claim 1, wherein the method further comprises:
in response to determining that the dynamic rule preference was changed from indicating that dynamic rule checking is not to be performed to indicating that dynamic rule checking is to be performed, the computer applying each design rule whose dynamic rule setting indicates that the design rule is a dynamic design rule to the schematic.

4. The computer-implemented method of claim 1, wherein the method further comprises:
in response to determining that the dynamic rule preference indicates that dynamic rule checking is not to be performed, the computer not applying design rules to the schematic regardless of the dynamic rule settings.

5. A non-transitory computer-readable storage medium storing instructions that, when executed by a computer, cause the computer to perform a method for providing design rule checking in an electronic design automation (EDA) application, the method comprising:
obtaining, through a graphical user interface (GUI), a set of design rules and, for each design rule in the set of design rules, a dynamic rule setting that indicates whether or not the design rule is a dynamic design rule;
obtaining a dynamic rule preference that indicates whether or not dynamic rule checking is to be performed; and
in response to the computer determining that the dynamic rule preference indicates that dynamic rule checking is to be performed and that a schematic was switched from a read-only mode to a read/write mode, the computer automatically applying each design rule whose dynamic rule setting indicates that the design rule is a dynamic design rule to the schematic by:
destroying non-signed-off markers in the schematic;
creating new markers based on applying each design rule whose dynamic rule setting indicates that the design rule is a dynamic design rule;
adding only those new markers to the schematic that do not match an existing signed-off marker.

6. The non-transitory computer-readable storage medium of claim 5, wherein the set of design rules correspond to semantic rules or electrical rules.

7. The non-transitory computer-readable storage medium of claim 5, wherein the method further comprises:
in response to determining that the dynamic rule preference was changed from indicating that dynamic rule checking is not to be performed to indicating that dynamic rule checking is to be performed, applying each design rule whose dynamic rule setting indicates that the design rule is a dynamic design rule to the schematic.

8. The non-transitory computer-readable storage medium of claim 5, wherein the method further comprises:
in response to determining that the dynamic rule preference indicates that dynamic rule checking is not to be performed, not applying design rules to the schematic regardless of the dynamic rule settings.

9. A computer system, comprising:
a processor; and
a non-transitory computer-readable storage medium storing instructions that, when executed by the processor, cause the computer system to perform a method for providing design rule checking in an electronic design automation (EDA) application, the method comprising:
obtaining, through a graphical user interface (GUI), a set of design rules and, for each design rule in the set of design rules, a dynamic rule setting that indicates whether or not the design rule is a dynamic design rule;
obtaining a dynamic rule preference that indicates whether or not dynamic rule checking is to be performed; and
in response to the computer system determining that the dynamic rule preference indicates that dynamic rule checking is to be performed and that a schematic was switched from a read-only mode to a read/write mode, the computer system automatically applying each design rule whose dynamic rule setting indicates that the design rule is a dynamic design rule to the schematic by:
destroying non-signed-off markers in the schematic;
creating new markers based on applying each design rule whose dynamic rule setting indicates that the design rule is a dynamic design rule;
adding only those new markers to the schematic that do not match an existing signed-off marker.

10. The computer system of claim 9, wherein the set of design rules correspond to semantic rules or electrical rules.

11. The computer system of claim 9, wherein the method further comprises:
in response to determining that the dynamic rule preference was changed from indicating that dynamic rule checking is not to be performed to indicating that dynamic rule checking is to be performed, applying each design rule whose dynamic rule setting indicates that the design rule is a dynamic design rule to the schematic.

12. The computer system of claim 9, wherein the method further comprises:
in response to determining that the dynamic rule preference indicates that dynamic rule checking is not to be performed, not applying design rules to the schematic regardless of the dynamic rule settings.

* * * * *